United States Patent [19]

Nagata

[11] Patent Number: 5,276,355

[45] Date of Patent: Jan. 4, 1994

[54] CHANGE-OVER CIRCUIT FOR TESTER IMPLEMENTED BY USING DIODE-BRIDGE TYPE ANALOG SWITCHES

[75] Inventor: Takahiro Nagata, Tokyo, Japan

[73] Assignee: Ando Electric Co., Ltd., Tokyo, Japan

[21] Appl. No.: 665,623

[22] Filed: Mar. 6, 1991

[30] Foreign Application Priority Data

Mar. 28, 1990 [JP] Japan .................... 2-80225

[51] Int. Cl.⁵ .................... G01R 1/30; G01R 11/02
[52] U.S. Cl. .................... 307/80; 307/115; 307/257; 324/158 R
[58] Field of Search .......... 324/158R; 307/80, 43, 307/52, 85, 18, 23, 25, 26, 27, 28, 29, 64, 65, 66, 67, 68, 70, 72, 73, 74, 75, 76, 81, 82, 86, 87, 113, 115, 352, 257; 363/67, 69

[56] References Cited

U.S. PATENT DOCUMENTS

| | | | |
|---|---|---|---|
| 2,965,823 | 12/1960 | Wolman | 307/257 |
| 4,209,711 | 6/1980 | Baker | 307/257 |
| 4,333,049 | 6/1982 | Yui et al. | 324/158 R |
| 4,437,096 | 3/1984 | Brightman et al. | 307/257 |
| 4,651,088 | 3/1987 | Sawada | 324/158 R |
| 4,720,671 | 1/1988 | Tada et al. | 324/158 R |
| 4,879,478 | 11/1989 | Gershon | 307/257 |

Primary Examiner—Howard L. Williams
Assistant Examiner—Richard T. Elms
Attorney, Agent, or Firm—Seidel, Gonda, Lavorgna & Monaco

[57] ABSTRACT

A change-over circuit for use in a tester for changing over a load and a driver to be connected to a device under test is implemented by using diode-bridge type analog switches which include a first diode-bridge type analog switch connected as collector loads for first and second transistors, a second diode-bridge type analog switch connected as collector loads for third and fourth transistors, respectively. The driver is connected to an input of the first diode-bridge type analog switch. The load circuit is connected to an input of the second diode-bridge type analog switch. The first and second diode-bridge type analog switches are so interconnected as to perform a differential operation in response to an ON/OFF control signal applied to the fourth transistor from the first transistor for thereby changing over the current and capacitive loads and the driver to be coupled to the device under test which is connected to outputs of the first and second diode-bridge type analog switches. The current and capacitive loads can both be turned on and off through differential cooperation of the first and second diode-bridge type analog switches to thereby allow the current and capacitive loads to be connected simultaneously or separately only when the driver is disabled or inhibited. Inexpensive and simplified switch circuit is thus provided.

3 Claims, 2 Drawing Sheets

CHANGE-OVER CIRCUIT FOR TESTER IMPLEMENTED BY USING DIODE-BRIDGE TYPE ANALOG SWITCHES

BACKGROUND OF THE INVENTION

1. Field of the Invention

The present invention relates generally to a tester including a driver, a comparator and a switching or change-over circuit for testing integrated circuits or devices (ICs). More particularly, the present invention is concerned with a change-over circuit incorporated in an IC tester apparatus for allowing load circuits to be automatically connected to a device under test in a driver-inhibited (disabled) mode and which circuit is implemented by employing diode-bridge type analog switches.

2. Description of the Prior Art

Before entering into description of the invention, a configuration of a prior art circuit for changing over loads for a device to be tested (hereinafter also referred to as the device under test) will briefly be elucidated by reference to FIG. 3 of the accompanying drawings.

In FIG. 3, a reference numeral 21 denotes a driver circuit, 22 denotes a device under test, 23 denotes a current load circuit, 24 denotes a capacitive load circuit, 25 denotes a comparator, and reference numerals 26 to 29 denote switches, respectively.

In operation, a drive signal is applied to a terminal 31 while an ON/OFF control signal is applied to a terminal 35. Further, a negative voltage $V_T$ is applied to a terminal 33, and a constant current is supplied through terminals 32 and 34 as a load current. With the circuit structure shown in FIG. 3, the current load circuit 22, the capacitive load circuit 24 and the comparator 25 can be changed over to operative state only when the output of the driver circuit 21 is disabled or inhibited by the switch 26.

When the switch 26 is turned on, the switches 27 to 29 are turned off, while the latter are turned on upon turning-off of the switch 26, as a result of which the current load circuit 23 and the capacitive load circuit 24 are switched on a real-time basis. On the other hand, when the driver is enabled (i.e. when the driver is released from the inhibited state), the current load circuit 23 and the capacitive load circuit 24 are disconnected.

As will be appreciated from the above description, in the case of the prior art circuit shown in FIG. 3, there are required three switches for changing over the current load circuit 23 and the capacitive load circuit 24, i.e. the switches 27 and 28 in association with the current load circuit 23 and the switch 29 in association with the capacitive load circuit 24, respectively, which in turn means that the circuits for operating these switches 27 to 29 are additionally required, thus giving rise to problems in respect to the current consumption as well as the manufacturing cost.

SUMMARY OF THE INVENTION

Accordingly, it is an object of the present invention to provide a driver/load change-over circuit for a tester designed to test IC devices, which circuit is substantially immune to the shortcomings of the prior art circuit mentioned above.

In view of the above and other objects which will become more apparent as description proceeds, there is provided according to a general aspect of the invention an improved load/driver change-over circuit for a tester apparatus for testing integrated circuit devices by using diode-bridge type analog switches. The load/driver change-over circuit comprises a first diode-bridge type analog switch (5, FIG. 1) connected as a collector load of a first transistor (1) and as a collector load of a second transistor (2), a second diode-bridge type analog switch (6) connected as a collector load of a third transistor (3) and as a collector load of a fourth transistor(4), a driver (21) connected to an input of the first diode-bridge type analog switch (5), and a current load circuit (23) and a capacitive load circuit (24) connected to an input of the second diode-bridge type analog switch, wherein a driver voltage is applied to the driver with a load voltage being applied to the load circuits, and wherein the first and second diode-bridge type analog switches are so interconnected as to perform a differential operation in response to an ON/OFF control signal applied to the fourth transistor from the first transistor for thereby changing over the load circuits and the driver output voltage to be coupled to a device under test (22) which is connected to an output of the first diode-bridge type analog switch (5) and the output of the second diode-bridge type analog switch (6).

Due to the circuit arrangement mentioned above, the current load circuit and the capacitive load circuit can both be turned on and off through differential cooperation of the first and second diode-bridge type analogue switches to thereby allow the current load circuit and the capacitive load circuit to be connected simultaneously or separately only when the driver is disabled or inhibited from operation.

BRIEF DESCRIPTION OF THE DRAWINGS

The invention will become more readily apparent from the following description of preferred embodiments thereof shown, by way of example only, in the accompanying drawings, wherein.

DESCRIPTION OF THE PREFERRED EMBODIMENTS

Now, the present invention will be described in conjunction with exemplary or preferred embodiments thereof by reference to FIGS. 1 and 2.

Figure 1:
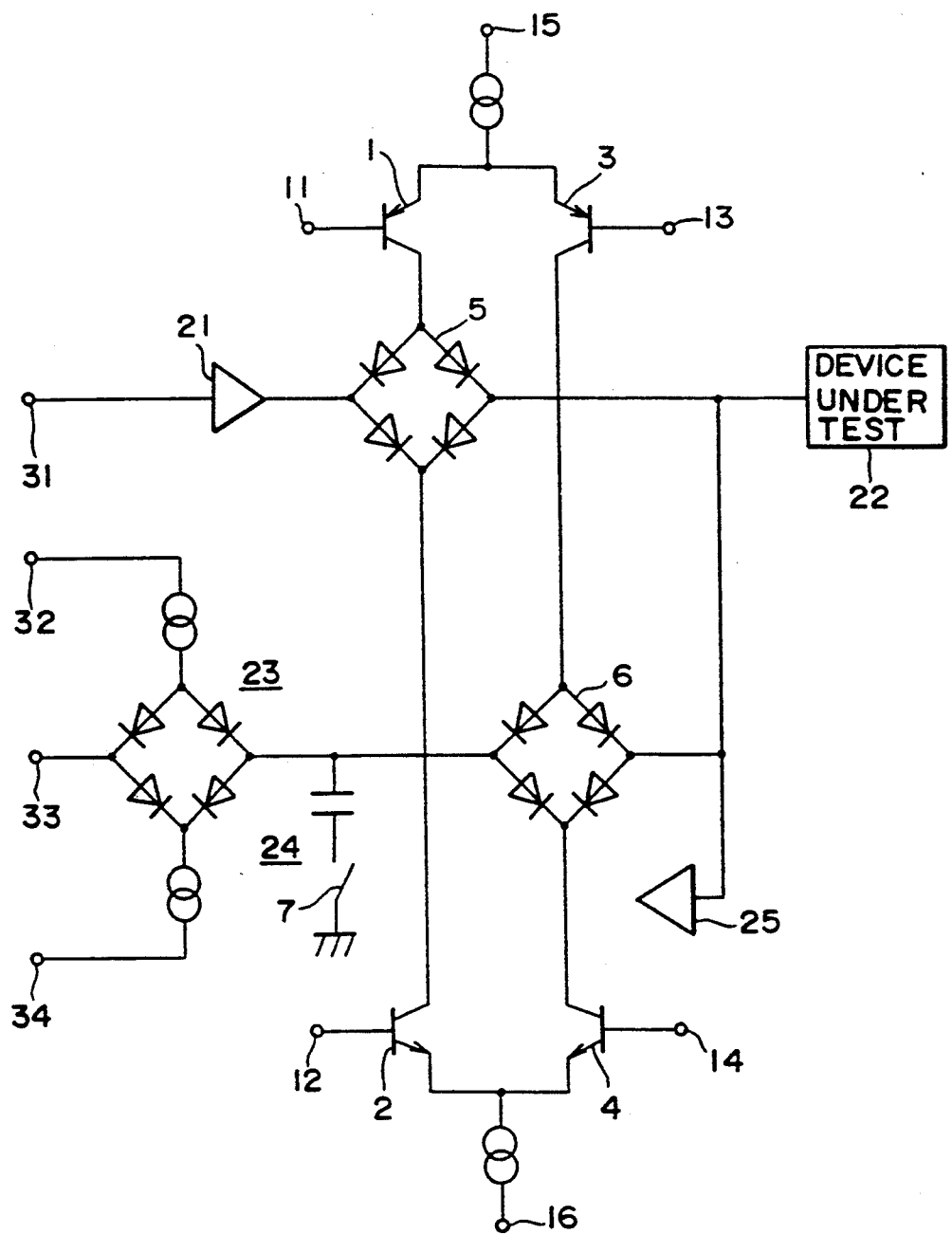
FIG. 1 is a schematic circuit diagram showing a configuration of a change-over circuit for an IC tester implemented by using diode-bridge type analog switches according to an embodiment of the invention.
Figure 3:
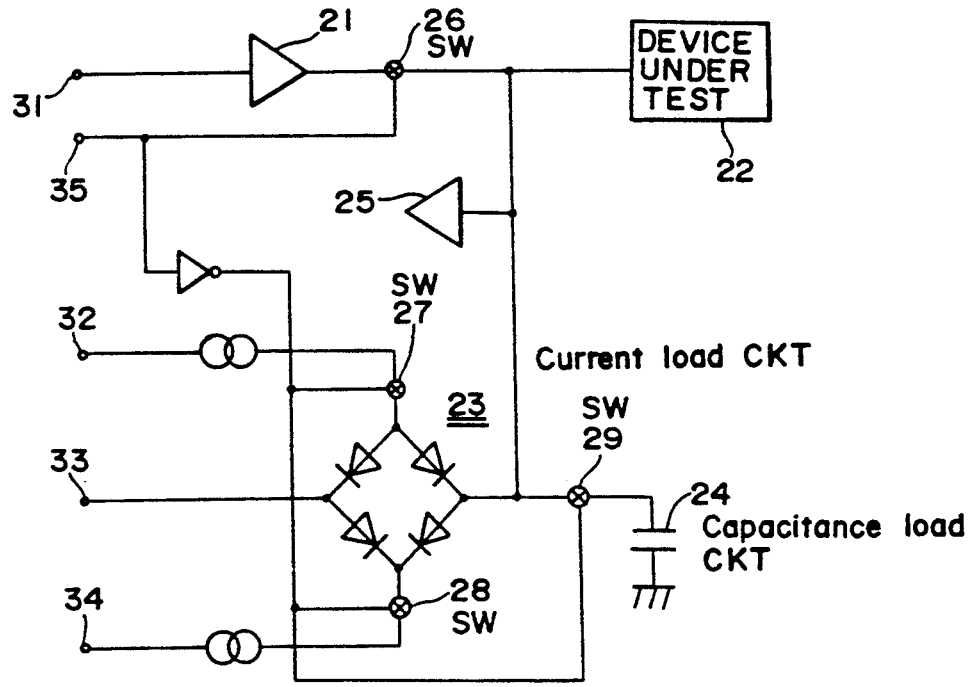
FIG. 3 is a schematic circuit diagram showing a configuration of a load change-over circuit known heretofore.

In FIG. 1 which shows a circuit for changing over a load and a driver voltage for a device under test, which circuit is implemented by using diode-bridge type analog switches according to an embodiment of the invention, reference numerals 1 to 4 denote transistors, 5 and 6 denote diode-bridge type analog switches, 7 denotes a switch, 11 to 14 denote ON/OFF control signal supply terminals, and 15 and 16 denote constant current supply terminals, respectively. The other reference numerals designate same or like parts as those indicated by the like numerals in FIG. 3.

Referring to FIG. 1, the diode-bridge type analog switch 5 is connected as a collector load of the transistor 1 and at the same time as a collector load of the transistor 2, while the diode-bridge type analog switch 6 is connected as a collector load for both the transistors 3 and 4.

The transistors 1 and 2 on one hand and the transistors 3 and 4 on the other hand operate differentially in response to the ON/OFF control signals applied to the terminals 11;12 and 13;14, respectively. More specifically, when the transistors 1 and 2 are turned on with the transistors 3 and 4 being off, the diode-bridge type analogue switch 5 is conducting (ON) with the diode-bridge type analog switch 6 being non-conducting (OFF). On the other hand, when the transistors 1 and 2 are "ON" with the transistors 3 and 4 being "OFF", the diode-bridge type analog switch 5 is turned off with the diode-bridge type analog switch 6 being "ON".

The switch 7 serves simply for disconnecting the capacitive load circuit 24 when only the current load circuit 23 is to be set up effective. Accordingly, it is not necessary to turn on and off this switch 7 on a real-time basis.

Now, description will be turned to the operation of the load change-over circuit shown in FIG. 1.

When the transistors 1 and 2 are turned on with the transistors 3 and 4 being turned off in response to the ON/OFF control signals applied to the terminals 11 to 14, the constant current supplied through the terminal 15 flows from the collector of the transistor 1 to the diode-bridge type analogous switch 5 and hence to the terminal 16 from the collector of the transistor 2, as a result of which the diode-bridge type analogous switch 5 is turned on to thereby allow a signal to be supplied to the device 22 under test through the driver 21. In that case, however, the current load circuit 23 and the capacitive load circuit 24 remain in the disconnected state, because the diode-bridge type analogous switch 6 is in the nonconductive (OFF) state.

Now assuming that the ON/OFF control signals applied to the terminals 11 to 14 are inverted in polarity, the transistors 1 and 2 are turned off while the transistors 3 and 4 are turned on due to the differential operation thereof. Thus, the constant current supplied through the terminal 15 flows from the collector of the transistor 3 to the diode-bridge type analog switch 6 and hence to the terminal 16 through the transistor 4. At this time point, the diode-bridge type analog switch 16 is turned on (closed), whereby the current load circuit 23 and the capacitive load circuit 24 are connected to the device 22 under test. On the other hand, the driver 21 is disabled or inhibited at this time point, because the diode-bridge type analog switch 5 is not conductive (OFF).

Operation of the load change-over circuit will be made more apparent from the waveform diagram of FIG. 2.

Figure 2:
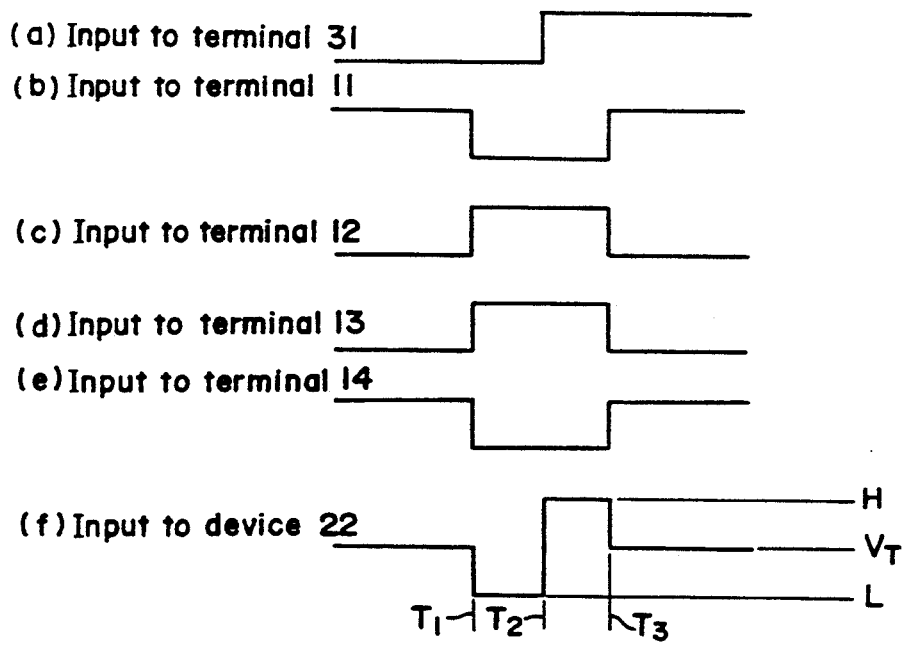
FIG. 2 is a waveform diagram showing waveforms of signals appearing at various circuit points in the circuit shown in FIG. 1 for illustrating operations thereof.

Referring to FIG. 2, the drive signal 31 has a waveform illustrated at (a), while the ON/OFF signals applied to the terminals 11 to 14 are of such waveforms as shown at (b) to (f), respectively.

As can be seen, the signal waveform shown at (d) is equivalent to the inversion of the waveform shown at (b). Thus, the transistors 1 and 2 on one hand and the transistors 3 and 4 on the other hand are turned on and off in a differential manner, which involves differential on/off operations of the diode-bridge type analog switches 5 and 6 correspondingly. The waveform shown at (f) represents that of the signal applied to the device 22 under test.

Since the diode-bridge type analog switch 5 assumes the off state until a time point $T_1$ with the diode-bridge type analog switch 6 being on, a load voltage $V_T$ is applied to the device 22 under test.

At the time point $T_1$, the diode-bridge type analog switch 5 is turned on with the switch 6 being off, as a result of which the signal H output from the driver 21 is supplied to the device 22 under test.

At a time point $T_2$, the signal L outputted from the driver 21 is supplied to the device 22 under test.

At a time point $T_3$, the diode-bridge type analog switch 5 is turned off with the switch 6 being on. Consequently, the load voltage $V_T$ is again applied to the device 22 under test.

In practical applications, selection may be made such that the level H of the output of the driver 21 is +3 volts, the level L is 0 volt, the load voltage $V_T$ is +1.5 volts, the load current is 10 mA and the load capacity is 100 pF, by way of example only.

As will now be appreciated from the foregoing, there can be realized according to the teachings of the invention a high-speed change-over circuit of a low current consumption for changing over the load and the driver signal for the device to be tested such as IC devices by virtue of adoption of the diode bridge type analog switches as the driver ON/OFF switch circuit.

While the invention has been described in terms of its preferred embodiments, it should be understood that numerous modifications may be made thereto without departing from the spirit and scope of the invention as defined in the appended claims. It is intended that all such modifications fall within the scope of the claims.

What is claimed is:

1. A circuit for selectively connecting either of a load circuit and a driver circuit to a device under test, comprising:

a first diode-bridge type analog switch connected as a collector load of a first transistor and as a collector load of a second transistor; and a second diode-bridge type analog switch connected as a collector load of a third transistor and as a collector load of a fourth transistor;

said driver circuit being connected to an input of said first diode-bridge type analog switch, and said device under test being connected to an output of said first diode-bridge type analog switch; and said load circuit being connected to an input of said second diode-bridge type analog switch, and said device under test being connected to an output of said second diode-bridge type analog switch;

a driver voltage being applied to said driver circuit, and a load voltage being applied to said load circuit, wherein said first and second diode-bridge type analog switches are so interconnected as to perform a differential operation in response to an ON/OFF control signal applied to said first through fourth transistors for thereby selectively connecting either of said load circuit and said driver circuit to said device under test.

2. A circuit according to claim 1, wherein said load circuit includes a current load circuitry and a capacitive load circuitry which are both connectable simultaneously to said device under test.

3. A circuit according to claim 2, further including means for disconnecting the capacitive load circuit, thereby allowing the current load circuit to be separably connected to the device under test.

* * * * *